United States Patent [19]

Upton

[11] Patent Number: 4,770,565

[45] Date of Patent: Sep. 13, 1988

[54] I. C. FEEDER FOR AUTOMATED PLACEMENT MACHINE

[75] Inventor: Orland E. Upton, Independence, Oreg.

[73] Assignee: Hewlett-Packard Company, Palo Alto, Calif.

[21] Appl. No.: 937,574

[22] Filed: Dec. 3, 1986

[51] Int. Cl.⁴ ............................................. B65G 53/66
[52] U.S. Cl. ....................................... 406/19; 406/195; 406/85; 29/743; 29/759
[58] Field of Search ............... 406/19, 22, 85, 195, 406/88, 86, 87, 51, 73, 191, 50, 93, 94; 29/759, 743; 209/573, 906

[56] References Cited

U.S. PATENT DOCUMENTS

| 3,947,236 | 3/1976 | Lasch, Jr. | 406/85 X |
| 4,561,806 | 12/1985 | Lenhart | 406/88 |
| 4,567,652 | 2/1986 | Gussman et al. | 29/759 X |

Primary Examiner—Galen Barefoot
Assistant Examiner—James M. Kannofsky
Attorney, Agent, or Firm—Donald N. Timbie; James M. Williams

[57] ABSTRACT

A feeder assembly comprising a feeder tube having metal rails mounted therein along which IC's can slide on the parts of their leads next to their body and at one end an adapter for guiding the IC's from a transport tube onto the rails. An opening in the feeder tube is provided for permitting pulses of gas to flow through the tube toward the end of the tube remote from the adapter so as to move the IC's to a pick-up pad at said remote end one at a time.

11 Claims, 4 Drawing Sheets

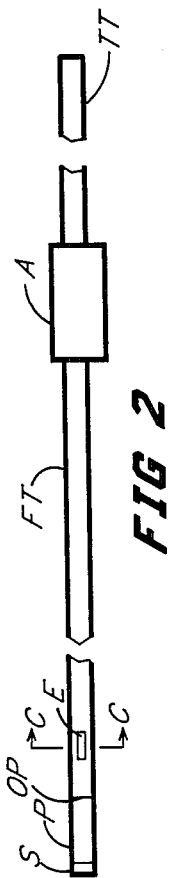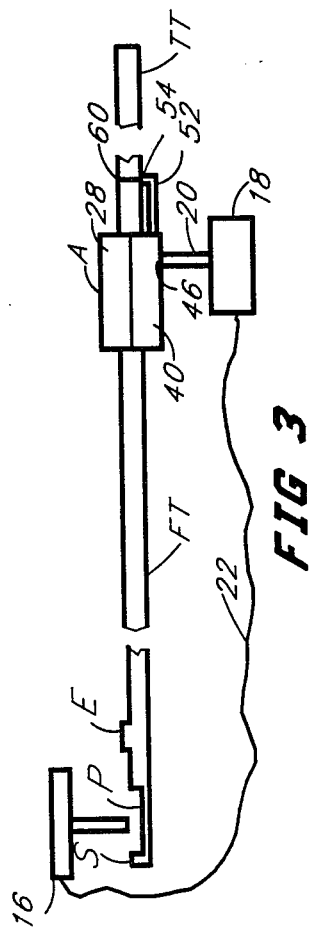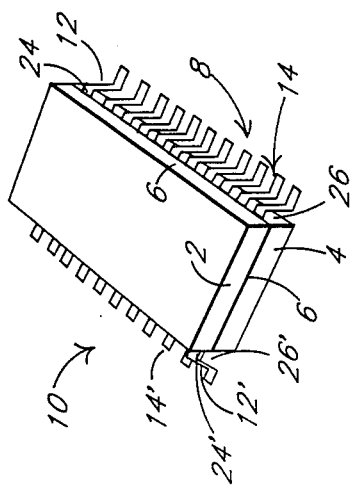

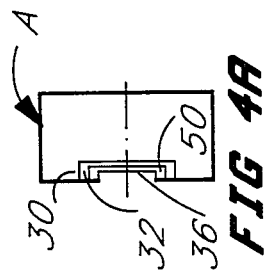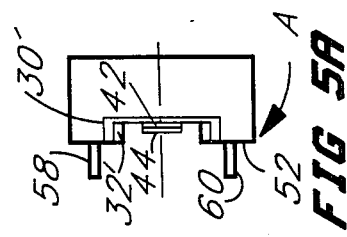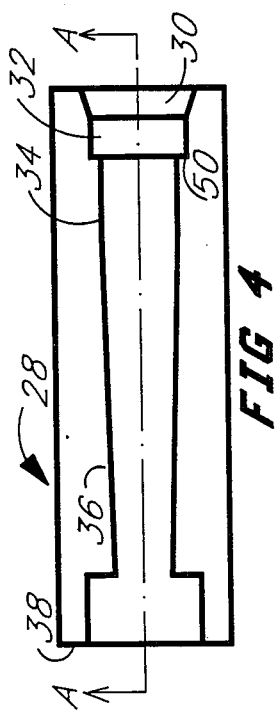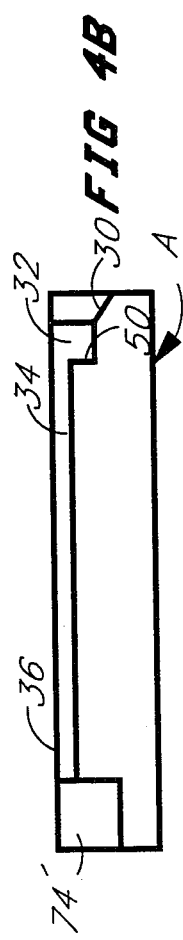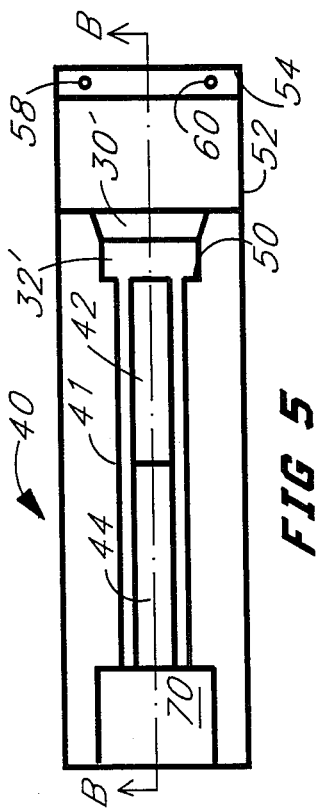

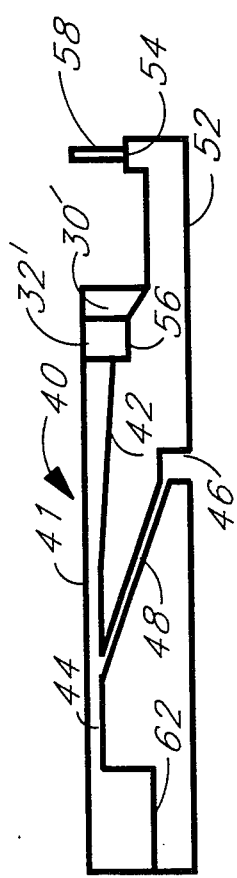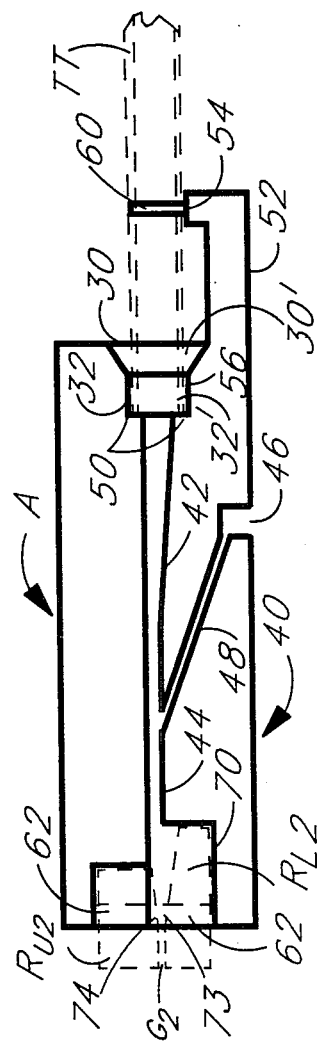

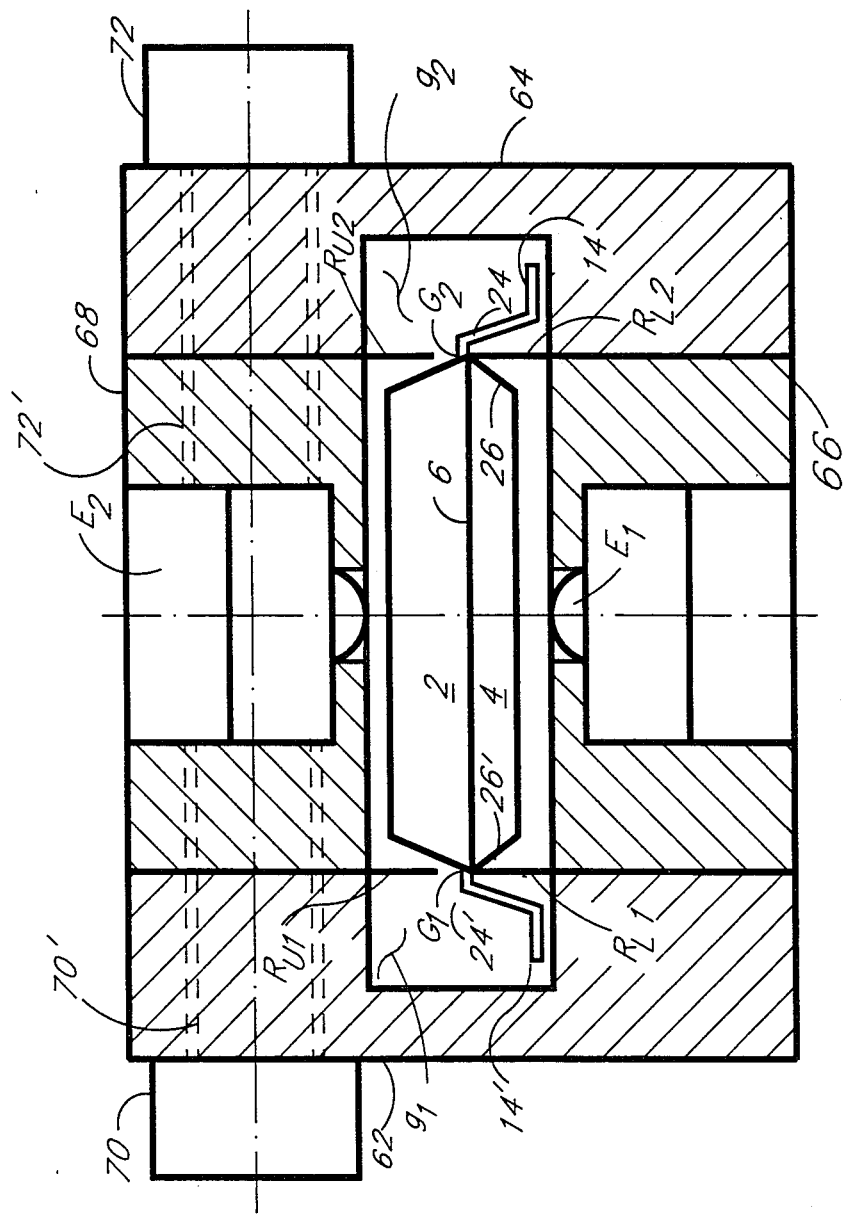

I. C. FEEDER FOR AUTOMATED PLACEMENT MACHINE

BACKGROUND OF THE INVENTION

Integrated circuits, IC's, are usually in the form of a thin rectangular plastic box with leads to appropriate points of the circuit within the box emerging perpendicularly from opposite sides thereof at points along straight parallel lines formed by the mold line between the top and bottom halves of the box. Intermediate portions of the leads that adjoin the portions emerging from the box are respectively bent at the same angle in planes perpendicular to the plane formed by the parallel lines, and the outer ends of the leads are bent outwardly in a plane parallel to the latter plane to form feet that are to be electrically and physically attached to appropriate points on a flat printed circuit board. Such a structure is illustrated in FIG. 1.

IC's are generally loosely packaged end to end in a transport tube with their feet facing parallels opposing inner walls. At a factory, feeders are provided for conveying the IC's from the transport tube to a pick-up pad from which they are carried by a programmed machine to appropriate positions on a circuit board.

There are two basic types of feeders. The first type has a built in magazine into which the components are transferred from the transportation tube and from which they are fed to the pick-up pad by either gravity or vibratory action or a combination of both. The second type of feeder has no magazine, and after the transport tube is attached to a bar by spring clips, the components are fed to the pick-up pad by vibrating action.

In both types of feeders, the feet at the ends of the electrical leads are used to guide the components onto the pick-up pad. The feet are very frequently rough and sharp. When the sharp feet contact the internal walls of a feeder, there is a strong tendency for them to dig in and cause a jam. Furthermore, the spacing between the feet on one side of the integrated circuit and the feet on the other is not held to a very close tolerance, so that for components having a smaller dimension there is sometimes enough excess clearance between the feet and the internal walls of the feeder to permit the integrated circuit to rotate a few degrees and increase the severity of the jam.

Any jams in the feeder are a serious problem for automatic 'pick and place' assembly machines because of 'missed pick' problems. Even with constant monitoring by the machine operator, it is impossible to achieve a satisfactory level of efficiency and reliability.

BRIEF SUMMARY OF THE INVENTION

A feeder constructed in accordance with this invention is comprised of a tubular feeder tube having a least one pair of thin, parallel rails, mounted therein, an adapter at one end of the feeder tube for guiding components emerging from a transport tube onto the rails, and means for directing pulses of gas along said feeder tube toward the end opposite the adapter at which a pick-up pad is located. As the components emerge from the adapter, they are positioned such that the rails are in the grooves between the body of the component and the intermediate portions of the leads. In a preferred embodiment, the IC's are prevented from leaving the rails by an additional pair of rails that are respectively spaced from and aligned with the first pair so as to form a gap through which the portion of the leads adjacent the body of the IC's extend.

When a transport tube is coupled to the adapter, a pulse of air is sent through the feeder tube and moves IC's into the feeder tube. The first IC will be on the pick-up pad at the remote end of the feeder tube. When it is removed therefrom, another pulse of air is sent through the feeder tube so as to force the IC's toward the pick-up pad.

BRIEF DESCRIPTION OF THE DRAWINGS

FIG. 1 is a projection view of an IC,

FIG. 2 is a top view of a pad, feeder tube, adapter and transport tube in operative relationship, FIG. 3 is a side view of apparatus of this invention that also shows the 'pick and place' mechanism and the means for producing pulses of gas, FIG. 4 is a view of the underside of the top half of an adapter, FIG. 4A is an end view of FIG. 4, FIG. 4B is a section AA of FIG. 4, FIG. 5 is a top view of the bottom half of an adapter, FIG. 5A is an end view of FIG. 5, FIG. 5B is a section BB of FIG. 5, FIG. 6 is a cross section of an adapter formed by combining FIG. 4B and 5B, and FIG. 7 is a cross section of a feeder taken at CC of FIG. 2.

DETAILED DESCRIPTION OF THE INVENTION

FIG. 1 illustrates a typical IC component comprised of a rectangular box having a top half 2 that is adjoined to a bottom half 4 along a straight mold line 6. One set of electrical leads 8 emerges perpendicularly from one side of the box 2, 4 at points along the mold line 6, and another set of electrical leads 10 emerges from the other side of the box 2, 4 in a similar fashion. Intermediate portions of the leads such as indicated at 12 are bent with like angles in planes perpendicular to the plane of the mold line 6, and the outer ends of the leads are bent into a plane parallel to the plane of the mold line 6 so as to form feet 14 and 14'. The feet 14 are to be electrically and physically attached to pads on a planar circuit board.

Because of manufacturing methods, the feet 14 are often sharp, and the dimension between the outer ends of the feet 14 and 14' are not held to close tolerances. Consequently, when, as in the feeder tubes of the prior art, the IC's are guided by the feet 14, 14' bearing against an inner wall, there is a good chance that the IC's will rotate and cause a jam.

FIG. 2 is a top view of a pick-up pad P having a stop S on the side remote from an outlet port OP of a feeder tube FT, the feeder tube FT, an adapter A and a transport tube TT. A photoelectrical eye E is located near the outlet port OP so as to give an operator warning as to when the IC's in the feeder tube FT are nearly used up.

FIG. 3 is a side view of the assembly of FIG. 2 and shows in addition a 'pick and place' device 16 and a means 18 for supplying pulses of air via a tube 20 to the feeder tube FT via the adapter A. When a transport tube TT is first coupled to the adapter A, a pulse of gas is supplied to the adapter A via the tube 20, and means not shown direct the air toward the outlet port OP so as to create a partial vacuum and suck IC's in the transport tube TT into the feeder tube FT. The transport tube may then be decoupled from the adapter A. The first IC emerging from TT will now be on the pad P and bear against the stop S.

When the pick and place apparatus 16 has removed the first IC from the pad P, means not shown are provided for producing a signal via a lead 22 to the air pulser 18 so as to cause it to introduce another pulse of air into the feeder tube FT and force the IC's toward the outlet port OP so that the second IC now rests on the pad P so that it can be picked up by the pick and place device 16.

As will be explained in detail in connection with FIG. 7, the feeder tube FT contains two pairs of parallel rails that are respectively separated from each other by a narrow gap. The purpose of the adapter A is to orient the IC's emerging from the transport tube TT so that the portions such as 24, 24' of the leads that are perpendicular to the box 2, 4, see FIG. 1, pass through the gap. Thus the rails of a lower pair will be respectively located in the grooves 26, 26' between the sides of the lower half 4 of the box 2, 4 and the intermediate sections 12, 12' of the leads, and the rails of the upper pair will be respectively above the portion 24, 24' of the leads.

FIG. 4 is a view of the underside of the top half 28, see FIG. 3, of the adapter A. Corresponding structures in FIGS. 4, 4A and 4B will be identified by the same numerals. A throat 30 that reduces in cross section as it approaches the inside of the adapter A serves to roughly orient the transport tube so that it can enter a channel section 32 with such horizontal orientation that the IC bodies and feet will enter a section 34 having parallel sides. The IC's then enter a channel section 36 that is tapered toward the remote end 38 of the adapter A. This serves to position the IC's horizontally so that their bodies will be between the rails and will be described in connection with FIG. 7.

FIG. 5 is a view of the top of the bottom half 40, see FIG. 3, of the adapter A. Corresponding structures in FIGS. 5A and 5B will be identified by the same numerals. It has a throat 30' apposing the throat 30 and a channel section 32' that opposes the channel section 32. A straight channel section 41 opposes the channel sections 34 and 36 in the top half 28. A ramp 42 rises toward the center of the adapter A so as to lift the body of the IC so as to align the portions 24, 24'' of the leads of an IC with the gaps between the rails. At the top of the ramp 42, there is an horizontal channel section 44.

As seen in FIG. 5B, which is a section BB of FIG. 5, a port 46, also shown in FIG. 3, is provided in the bottom of the half 40 of the adapter A and is such that the tube 20 can be coupled to it. A passageway 48 is connected between the port 46 and the channel section 44 so that pulses of gas supplied by the means 18 are directed toward the outlet port OP of the feeder tube Ft.

In order that the partial vacuum created by these pulses of air not be reduced, it is essential that a transport tube be coupled to the adapter A with a reasonable degree of tightness. This is brought about by forming an annular shoulder 50 at the inner end of the channel section 32 against which the end of the transport tube TT can bear. As an aid to positioning TT in this way, the bottom half 40 of the adapter A is extended beyond the upper half as indicated at 52 in FIG. 5B, a ledge 54 is formed on it at the level of the bottom 56 of the channel section 32', and pins 58 and 60 are mounted on top of the ledge 54.

Before proceeding with a description of FIG. 6 showing a cross section of the assembled upper and lower halves of the adapter A, attention is now given to FIG. 7 for a detailed description of the feeder tube FT as it would appear at section CC of FIG. 2.

In this particular embodiment, the feeder tube FT is comprised of sides 62 and 64 that are made of aluminum. Spacer bars 66 and 68 that may be made of aluminum or acrylic are mounted between the sides 62 and 64. The lower rails $RL_1$ and $RL_2$ are respectively located between the side 62 and the lower spacer bar 66 and between the spacer bar 66 and the side 64. The rails may be made of metal such as Be Cu. The assembly is clamped together by bolts 70 and 72 that extend through the sides 62 and 64 respectively and are threaded into holes 70' and 72' in the spacer 68. Other bolts can be used if desired.

Although not shown in FIG. 7, the rails are straight and parallel; $RL_1$ and $RU_1$ are opposed so as to form a gap $G_1$ between them. An IC 2,4 is shown mounted on the rails as desired. The body 2,4 of an IC is located between the rails, and the portions 24' and 24 of the leads that extend perpendicularly from opposite sides of 2,4 are respectively located in the gaps $G_1$ and $G_2$. In order to provide space for the rest of the leads, grooves $g_1$ and $g_2$ are located on the inside surface of sides 62 and 64 respectively.

The grooves $g_1$ and $g_2$ are in registration with the space between the spacers 66 and 68 and are of such dimension that the leads cannot touch the walls of the feeder tubes FT. Guidance is provided by contact of the rails in the grooves 26, 26'. Photoelectric devices $E_1$ and $E_2$ are mounted in the space between the spacers 66 and 68 so as to detect the presence of an IC 2, 4 in the space between the spacers 66 and 68.

FIG. 6 is a vertical center cross section of an adapter A and is in fact an an inversion of FIG. 4B shown on top of FIG. 5B. In order to more clearly illustrate the relative positions of the various parts, the transport tube TT and the rails $RL_2$ and $RU_2$ are shown, and in order to clarify the drawing, they are shown in dashed lines.

The transport tube TT rests on the ledge 54 and between the pins 58 and 60. One end of TT fits into the channel section 32, 32' and contacts the annular shoulder 50. Strictly speaking, the rails would not be seen in a center cross-section, such as FIG. 6, but RL2 and RU2 are shown so that the the relative positions of the various parts can be more clearly understood. RL2 rests on a ledge 70 in the end of the bottom half 40 of the adapter A. The side 62 of the feeder tube FT also rests on the ledge 70, but the rails RL2 and RU2 extend beyond it. This is the inlet port of FT. The upper surface of the end of RL2 is tapered as indicated at 73. It is shown as ending below the level of the channel section 44 but it could be even with it. The upper rail RU2 projects into a niche 74' in the end of the upper half 28 of the adapter A. Its bottom surface slopes upwardly as indicated at 74. Other designs could be used to couple the inlet port and rails to the adapter A, but the tapers 73 and 74 prevent the leads extending from the body 2, 4 of an IC from being hung up.

The overall operation is as follows. When the transport tube TT in the position shown and a pulse of gas is sent through the passageway 48, it passes into the space between the spacers 62 and 64 and creates a partial vacuum which sucks the IC's from TT so as to quickly transfer them from TT to FT. The foremost IC now rests on the pad P. After it is picked up, another pulse of gas is sent into the passageway 48 so as to advance the IC's along the feeder tube FT. When the last IC passes the photoelectric device, $E_1$, $E_2$ provides a signal so that an operator knows that the feeder tube FT is nearly out of IC's.

Instead of supplying the pulses of gas into the adapter A they could be supplied at the end of the transport tube TT. During the loading of FT as well as in the subsequent advance of the IC's to the pick-up pad or the TT could be removed after initial loading of the FT and the pulses of gas could be applied to the adaptor A.

The feeder tube FT may be constructed in a number of ways to act as an electrical shield, and whereas this is not necessary it is preferable.

It has been presumed that the IC's will be received in the usual transport tube such as TT, but in accordance with another aspect of the invention, the transport tube could be like the feeder tube FT but no adapter would be required except when loading the tube with IC's.

Although the word tube is used herein, no specific cross section is intended.

I claim:

1. A feeder for conveying electrical components having leads projecting from parallel straight lines on opposite sides thereof and bent so as to form grooves between them and the component comprising:
   a feeder tube having an inlet port and an outlet port,
   a pair of parallel rails mounted in said tube, and
   an adapter coupled to said inlet port for guiding components introduced to said adapter so that said rails respectively project into said grooves so as to be the sole support of said components.

2. Apparatus as set forth in claim 1 having a pad mounted adjacent said outlet port.

3. Apparatus as set forth in claim 2 wherein a stop is mounted on said pad at a given distance from said outlet port.

4. Apparatus as set forth in claim 3 having means for picking up a component from said pad, and
   means for causing a pulse of gas to flow through said feeder tube after said latter means has picked up a component.

5. Apparatus as set forth in claim 1 wherein said adapter is comprised of:
   means defining a passageway with side walls that come closer together as they approach said inlet port so as to position the bodies of components horizontally between said parallel rails, and
   a ramp in said passageway for positioning the bodies of said components vertically with respect to said rails.

6. Apparatus as set forth in claim 1 in which said rails are made of metal.

7. Apparatus as set forth in claim 6 wherein at least a portion of said feeder tube is made of metal.

8. Apparatus as set forth in claim 6 wherein said feeder tube is an electrical shield.

9. An adapter for transferring IC's from a transport tube to a feeder tube having parallel rails therein comprising:
   a bottom section having a first groove in one surface thereof that has a bottom of a given width and sides of a given height,
   a ramp that is narrower than said first groove mounted on said bottom with spaces between it and said sides for accommodating leads from an IC traveling along said ramp, the height of said ramp from said bottom being a minimum at one end of said first groove and a maximum that is less than the height of said sides, and
   a top section having a second groove in a surface thereof that faces said first groove and is aligned with it, said second groove having a section that narrows as it approaches the other end of said first groove so as to bring IC's traveling along said grooves to a desired position along a line parallel to said grooves.

10. A feeder as set forth in claim 1 having an additional pair of rails that are parallel to said pair of rails and spaced therefrom so as to form first and second gaps between respective rails of each pair and wherein said adapter guides the portion of said leads adjacent opposite sides of said components into said first and second gaps respectively.

11. A feeder as set forth in claim 1 having means through which pulses of gas may be made to pass in said feeder tube toward its outlet port.

* * * * *